(12) United States Patent
Lee

(10) Patent No.: US 8,737,128 B2
(45) Date of Patent: May 27, 2014

(54) SEMICONDUCTOR MEMORY DEVICE AND METHOD OF OPERATING THE SAME

(71) Applicant: SK hynix Inc., Icheon-si (KR)

(72) Inventor: Hyung Min Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 8 days.

(21) Appl. No.: 13/726,924

(22) Filed: Dec. 26, 2012

(65) Prior Publication Data
US 2014/0063944 A1    Mar. 6, 2014

(30) Foreign Application Priority Data
Aug. 29, 2012    (KR) .......................... 10-2012-0095084

(51) Int. Cl.
*G11C 16/06* (2006.01)

(52) U.S. Cl.
USPC ............. 365/185.09; 365/185.12; 365/185.18

(58) Field of Classification Search
CPC ........... G11C 11/5628; G11C 11/5642; G11C 16/0483; G11C 16/26; G11C 16/10; G11C 16/3427; G11C 16/30
USPC ................... 365/185.09, 185.12, 185.18, 200, 365/189.09
IPC .......... G11C 11/5628,11/5642, 16/0483, 16/26, G11C 16/10, 16/3427, 16/30
See application file for complete search history.

(56) References Cited

U.S. PATENT DOCUMENTS 8,427,873 B2 * 4/2013 Mokhlesi ................. 365/185.09

FOREIGN PATENT DOCUMENTS

| KR | 100865830 B1 | 10/2008 |
| KR | 1020100007715 A | 1/2010 |

* cited by examiner

*Primary Examiner* — David Lam
(74) *Attorney, Agent, or Firm* — Haynes and Boone, LLP

(57) ABSTRACT

A semiconductor memory device and a method of operating the same are disclosed. The semiconductor memory device includes a memory cell block configured to have memory cell groups, a peripheral circuit configured to read data by supplying a read voltage to memory cells in the memory cell groups, a fail detection circuit configured to perform a pass/fail check operation of memory cell groups according to the data read by the peripheral circuit and a control circuit configured to control the peripheral circuit and the fail detection circuit to perform again the read operation about the memory cell groups using a compensation read voltage different from the read voltage in the event that it is determined that one or more memory cell group is failed according to the pass/fail check operation.

20 Claims, 3 Drawing Sheets

200
SEMICONDUCTOR MEMORY DEVICE AND METHOD OF OPERATING THE SAME

CROSS-REFERENCE TO RELATED APPLICATION

This application claims priority from Korean Patent Application No. 10-2012-0095084, filed on Aug. 29, 2012, the contents of which are incorporated herein by reference in its entirety.

BACKGROUND

The present invention relates to a semiconductor memory device and a method of operating the same, and more particularly relates to a semiconductor memory device having a rapid read velocity and a method of operating the same.

Recently, a non-volatile memory device, which is both programmable and electrically erasable, but does not require a refresh function, has been widely used. Accordingly, it would be advantageous to have non-volatile memory devices with an improved reliability and/or an improved read velocity.

SUMMARY OF THE INVENTION

Some embodiments of the present invention may provide a semiconductor memory device for improving reliability and/or velocity of a read operation and a method of operating the same.

A semiconductor memory device according to one embodiment of the present invention includes a memory cell block configured to have memory cell groups; a peripheral circuit configured to read data by supplying a read voltage to memory cells in the memory cell groups; a fail detection circuit configured to perform a pass/fail check operation of memory cell groups according to the data read by the peripheral circuit; and a control circuit configured to control the peripheral circuit and the fail detection circuit to perform again the read operation about the memory cell groups using a compensation read voltage different from the read voltage in the event that it is determined that one or more memory cell group is failed according to the pass/fail check operation.

A semiconductor memory device according to another embodiment of the present invention includes a memory cell block configured to include memory cells; a voltage supplying circuit configured to supply a read voltage to a word line of the memory cell block in a read operation; a page buffer circuit configured to include page buffer groups for reading data in the memory cells and storing the read data when the read operation is performed; a fail detection circuit configured to perform a pass/fail check operation about each of the page buffer groups according to the read data stored in the page buffer groups; and a control circuit configured to control the voltage supplying circuit and the page buffer circuit to perform again the read operation about the memory cell block using a compensation read voltage lower than the read voltage in the event that it is determined that the read data stored in one or more page buffer group is failed according to the pass/fail check operation.

A method of operating a semiconductor memory device according to one embodiment of the present invention includes performing a read operation using a read voltage; performing a pass/fail check operation about each of memory cell groups; and performing again the read operation using a compensation read voltage lower than the read voltage in the event that it is determined that one or more memory cell group is determined as failed according to the pass/fail check operation. Here, a memory cell group determined as passed in prior pass/fail check operation is determined as passed in the pass/fail check operation.

A method of operating a semiconductor memory device according to another embodiment of the present invention includes reading data in a memory cell block including memory cell groups using a first read voltage group; performing a pass/fail check operation about each of the memory cell groups; and reading again the data in the memory cell block including a memory cell group determined as failed using a second read voltage group lower than the first read voltage group in the event that it is determined that one or more memory cell group is failed according to the pass/fail checking operation, and performing again the pass/fail check operation.

A semiconductor memory device of the present invention may improve reliability of a read operation by repeating the read operation on a failed memory cell group using a compensation read voltage lower than a read voltage used in a prior read operation, and improve velocity of the read operation by skipping the step of repeating the read operation on a memory cell group which has passed.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter some embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Non-volatile memory devices may enable electrical program and erase operations, and may perform the program operation and the erase operation by changing a threshold voltage of a memory cell according to a movement of electrons by an electric field provided to a thin oxide layer. Here, the program operation may include an operation of storing electrons in a floating gate of the memory cell, and the erase operation may include an operation of discharging electrons in the floating gate. A read operation may be performed by sensing data relative to a threshold voltage of the programmed memory cells in the non-volatile memory device.

The non-volatile memory device may include a memory cell array having matrix-type memory cells for storing data, and a page buffer for programming data to the memory cell or reading data from the memory cell. The page buffer may include a pair of bit lines coupled to the memory cell, a register for temporarily storing data to be programmed to the memory cell array or temporarily storing data read from the memory cell, a sensing node for sensing a voltage of the bit line or the register, and a bit line select section for controlling coupling between the bit line and the sensing node.

Because electrons may be discharged from the floating gate over time after data is programmed, the threshold voltage of the memory cells in the non-volatile memory device may become lower. As a result, programmed data may be different from read data in the read operation, and so the read operation may result in an error.

Figure 1:
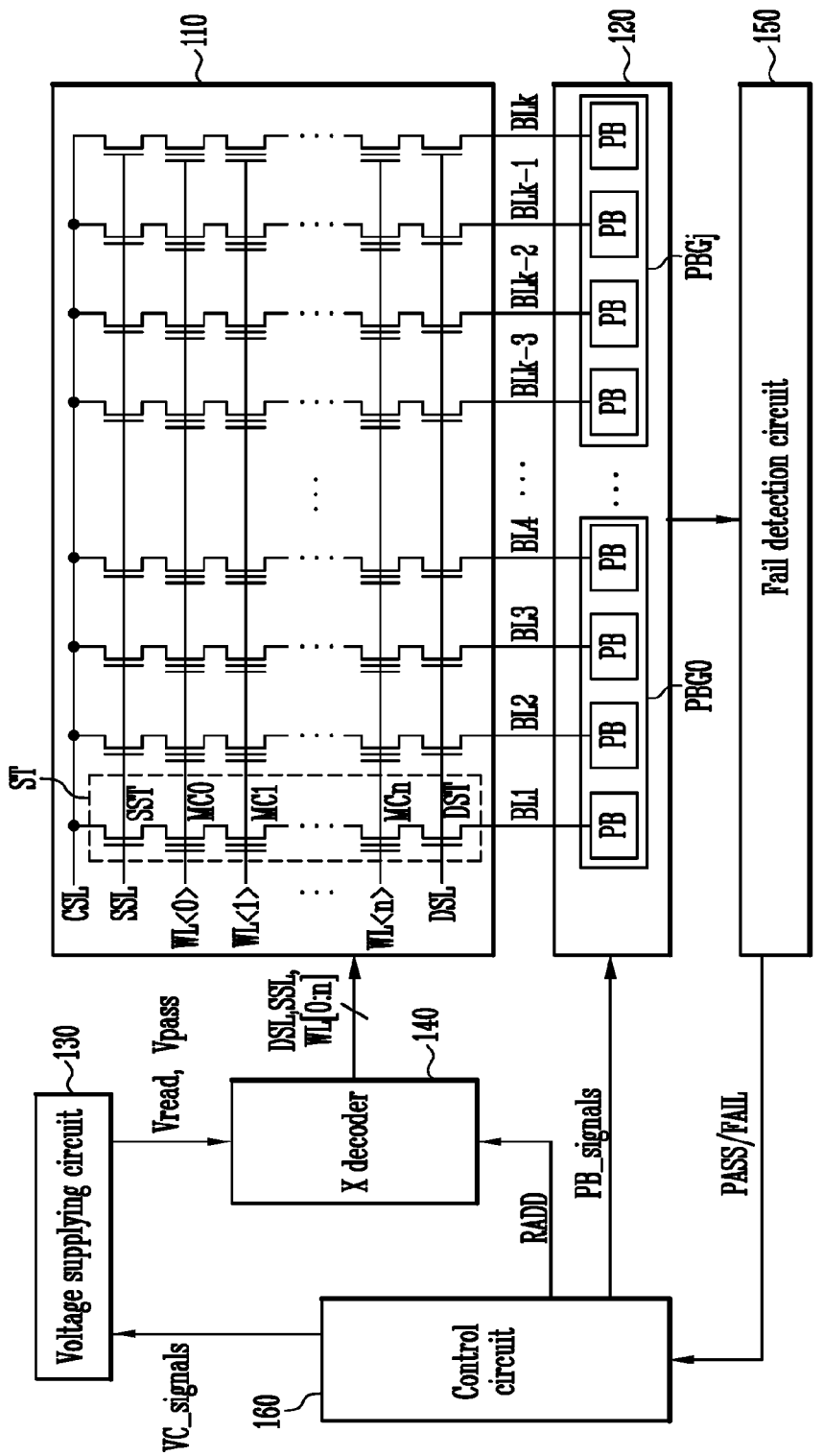
FIG. 1 is a block diagram illustrating a semiconductor memory device according to some embodiments.

FIG. 1 is a block diagram illustrating a semiconductor memory device according to some embodiments.

In FIG. 1, the semiconductor memory device may include a memory cell block 110, a page buffer circuit 120, a voltage supplying circuit 130, an X decoder 140, a fail detection circuit 150, and a control circuit 160.

The memory cell block 110 may include memory strings ST. The memory strings ST may be coupled in parallel between bit lines BL1 to BLk and a common source line CSL. Each of the memory strings ST may include a drain select transistor DST, memory cells MC0 to MCn and a source select transistor SST. Memory cells in the memory cell block 110 may be grouped in memory cell groups corresponding to the page buffer groups in the page buffer circuit 120.

The page buffer circuit 120 may include page buffers PB. Each of the page buffers PB may be coupled to the bit lines BL1 to BLk of the memory cell block 110. Although only one bit line is coupled to one page buffer in FIG. 1, in some embodiments, two or more bit lines may be coupled to one page buffer. The page buffers PB may be grouped in page buffer groups PBG0 to PGBj. That is, some of page buffers in the page buffer circuit 120 may be defined as one page buffer group. Additionally, memory cells corresponding to each of the page buffer groups PBG0 to PBGj may be grouped in the memory cell group.

The page buffer circuit 120 may sense a threshold voltage of selected memory cells through bit lines BL1-BLk of the memory cell block 110 in response to page buffer control signals PB_signals output from the control circuit 160 when a read operation is performed and store the sensed result as a read data.

The page buffer circuit 120 may skip a re-read operation of page buffer groups PBG0-PBGj determined to have passed a prior read operation when the re-read operation is performed on other page buffer groups PBG0-PBGj after setting a read voltage to a compensation read voltage during the read operation. The page buffer circuit 120 may also store new read data by performing the re-read operation on only page buffer groups PBG0-PBGj determined to have failed the prior read operation.

The voltage supplying circuit 130 may generate a read voltage Vread and a pass voltage Vpass in response to voltage supplying circuit control signals VC_signals output from the control circuit 160 when the read operation is performed. Furthermore, the voltage supplying circuit 130 may adjust and output a voltage level of the read voltage Vread in response to the voltage supplying circuit control signals VC_signals when the read operation is performed.

The X decoder 140 may deliver the read voltage Vread, the pass voltage Vpass, and an operation voltage to word lines WL0 to WL31 and the select lines SSL and DSL in the memory cell block 110 according to a row address RADD received from the control circuit 160.

The fail detection circuit 150 may perform a failed bit detection operation on each of the page buffer groups PBG0-PBGj when the read operation is performed. In some embodiments, the fail detection circuit 150 may perform the failed bit detection operation on each of the page buffer groups PBG0-PBGj, detect and count failed bits in the read data by using the read data stored in the page buffers PB included in each of the page buffer groups PBG0-PBGj, compare the number of counted failed bits with a number of correctable bits, and output a pass/fail signal PASS/FAIL based on the comparing result. In some embodiments, the fail detection circuit 150 may output a pass signal PASS in the event that the number of counted failed bits is the same as or smaller than the number of correctable bits and output a fail signal FAIL in the event that the number of counted failed bits is higher than the number of correctable bits.

The control circuit 160 may output the page buffer control signals PB_signals for controlling the page buffer circuit 120 in the read operation, output the voltage supplying circuit control signals VC_signals for controlling the voltage supplying circuit 130, and output the row address RADD for controlling the X decoder 140.

The control circuit 160 may control the voltage supplying circuit 130 to output the compensation read voltage generated by setting a new voltage level of the read voltage Vread output from the voltage supplying circuit 130 based on the pass/fail signal PASS/FAIL output from the fail detection circuit 150 when the read operation is performed. In some embodiments, the control circuit 160 may control the page buffer group 120 to skip the re-read operation on the page buffer groups PBG0-PBGj determined to have passed the prior read operation according to the pass/fail signal PASS/FAIL and store new read data by performing the re-read operation on only the page buffer groups PBG0-PBGj determined to have failed in the prior read operation.

Figure 2:
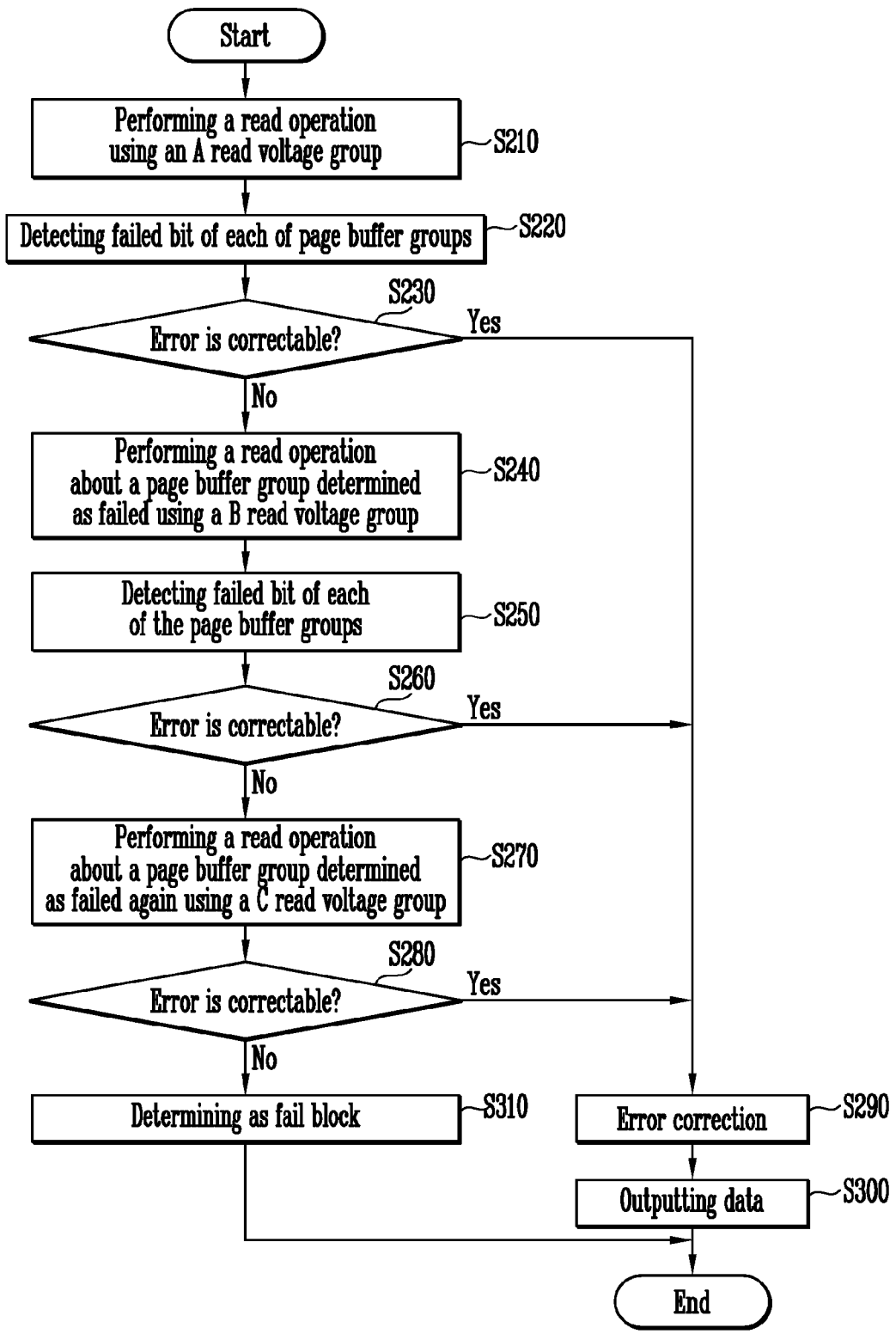
FIG. 2 is a flowchart illustrating operation of a semiconductor memory device according to some embodiments.

FIG. 2 is a flowchart illustrating operation of a semiconductor memory device according to some embodiments.

Figure 3:
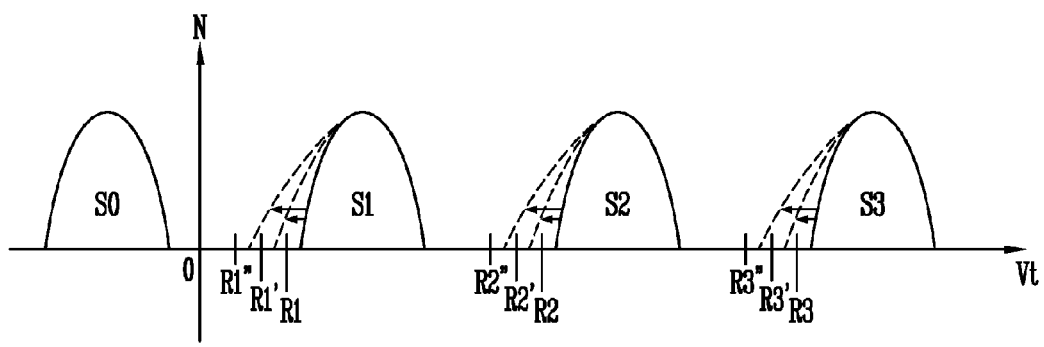
FIG. 3 is a view illustrating a threshold voltage distribution of a semiconductor memory device according to some embodiments.

FIG. 3 is a view illustrating a threshold voltage distribution of a semiconductor memory device according to some embodiments.

Hereinafter, a read operation of a semiconductor memory device according to some embodiments will be described in detail with reference to FIG. 1 to FIG. 3.

A read operation may be performed using an A read voltage group in step S210.

The voltage supplying circuit 130 may generate read voltages R1, R2 and R3 corresponding to the A read voltage group in response to the voltage supplying circuit control signals VC_signals output from the control circuit 160. The X decoder 140 may supply the read voltages R1, R2 and R3, in sequence, to a word line selected from word lines WL0-WLn based on the row address RADD, and supply the pass voltage Vpass to word lines WL0-WLn not selected.

The page buffers PB in the page buffer circuit 120 may store the read data by sensing a voltage of the bit lines BL1 to BLk coupled to the page buffers PB whenever the read voltages R1, R2 and R3 are supplied in sequence.

Failed bits may be detected for each of the page buffer groups PBG0-PBGj in step S220.

The fail detection circuit 150 may perform a failed bit detection operation on each of the page buffer groups PBG0-PBGj in the page buffer circuit 120. In some embodiments, the fail detection circuit 150 may perform the failed bit detection operation on each of the page buffer groups PBG0-PBGj, detect failed bits in the read data using the read data stored in the page buffers PB included in each of the page buffer groups, and count the failed bits.

Whether an error is correctable may be detected in step S230.

The fail detection circuit 150 may perform a pass/fail check operation on the memory cell group corresponding to each of the page buffer groups PBG0-PBGj. In some embodiments, the fail detection circuit 150 may compare the number of counted failed bits in each of the page buffer groups PBG0-PBGj with the number of correctable bits and detect whether errors of the read data may be correctable based on the comparing result. In some examples, the fail detection circuit 150 may perform the pass/fail check operation and output the pass signal PASS when the number of counted failed bits is the same as or smaller than the number of correctable bits and output the fail signal FAIL when the number of the counted failed bits is higher than the number of correctable bits.

A read operation is performed on the failed page buffer groups PBG0-PBGj using a B read voltage group in step S240.

In some embodiments, when the failed bit detection operation of the page buffer groups PBG0-PBGj is determined to have failed in the step S230, the voltage supplying circuit 130 may generate read voltages R1', R2' and R3' corresponding to the B read voltage group in response to the voltage supplying circuit control signals VC_signals output from the control circuit 160. In some examples, the B read voltage group may be lower in voltage than the A read voltage group by a preset voltage.

The X decoder 140 may supply the read voltages R1', R2' and R3', in sequence, to the word line selected from the word lines WL0-WLn based on the row address RADD, and supply the pass voltage Vpass to word lines WL0-WLn not selected.

The page buffers PB in the page buffer circuit 120 may store the read data by sensing a voltage of the bit lines BL1 to BLk coupled thereto whenever the read voltages R1', R2' and R3' are supplied in sequence. In some embodiments, the read operation on the page buffers PB included in the page buffer groups PBG0-PBGj determined to have passed in a prior fail bit detection operation may be skipped. As a result, the read data stored in the prior read operation may be maintained.

In some embodiments, when the read operation is performed by using the B read voltage group, the read voltage may be lower than a read voltage used in the prior read operation. Accordingly, a threshold voltage distribution of the memory cells may become lower over time, and thus a likelihood that errors may occur in the read operation may be reduced.

Failed bits may be detected for each of page buffer groups PBG0-PBGj in step S250.

The fail detection circuit 150 may perform the failed bit detection operation on each of the page buffer groups in the page buffer circuit 120. In some embodiments, the fail detection circuit 150 may perform the failed bit detection operation on each of the page buffer groups PBG0-PBGj, detect the failed bits in the read data using the read data stored in the page buffers PB included in each of the page buffer groups PBG0-PBGj, and count the failed bits. According to some embodiments, because the page buffers PB in the page buffer groups PBG0-PBGj determined to have passed in the prior failed bit detection operation maintain the read data from the prior read operation, the page buffers PB may be passed when the failed bit detection operation is performed again. Accordingly, the failed bit detection operation on the page buffer groups PBG0-PBGj determined to have passed in the step S220 may be skipped in the step S250.

Whether the error is correctable may be determined in step S260.

The fail detection circuit 150 may perform a pass/fail check operation on the memory cell group corresponding to each of the page buffer groups PBG0-PBGj. In some embodiments, the fail detection circuit 150 may compare the number of counted failed bits in each of the page buffer groups PBG0-PBGj with the number of correctable bits and detect whether the error of the read data is correctable based on the comparing result. The fail detection circuit 150 may perform the pass/fail check operation and output the pass signal PASS when the number of the counted failed bits is the same as or smaller than the number of correctable bits and output the fail signal FAIL when the number of counted failed bits is higher than the number of correctable bits.

A read operation is performed on the page buffer groups PBG0-PBGj that failed again, using a C read voltage group in step S270.

When the failed bit detection operation on the page buffer groups PBG0-PBGj is determined to have failed in the step S260, the voltage supplying circuit 130 may generate read voltages R1", R2" and R3" corresponding to the C read voltage group in response to the voltage supplying circuit control signals VC_signals output from the control circuit 160. In some embodiments, the C read voltage group may be lower in voltage than the B read voltage group by a preset voltage.

The X decoder 140 may supply the read voltages R1", R2" and R3", in sequence, to the word line selected from the word lines WL0-WLn based on the row address RADD, and supply the pass voltage Vpass to the word lines WL0-WLn not selected.

The page buffers PB in the page buffer circuit 120 may store the read data by sensing a voltage of the bit lines BL1 to BLk coupled thereto whenever the read voltages R1", R2" and R3" are supplied in sequence. In some embodiments, the read operation on the page buffers PB included in the page buffer groups PBG0-PBGj determined to have passed in the step S250 (the prior failed bit detection operation) may be skipped. As a result, read data stored in the prior read operation may be maintained.

In some embodiments, when the read operation is performed using the C read voltage group, the read voltage may become lower than the read voltage used in the prior read operation. Accordingly, a threshold voltage distribution of the memory cells may get lower over time, and thus a likelihood that errors may occur in the read operation may be reduced.

Whether the error is correctable may be determined in step S280.

The fail detection circuit 150 may performs a pass/fail check operation on the memory cell group corresponding to each of the page buffer groups PBG0-PBGj. In some embodiments, the fail detection circuit 150 may compare the number of counted failed bits in each of the page buffer groups PBG0-PBGj with the number of correctable bits and detect whether the error of the read data is correctable based on the comparing result. The fail detection circuit 150 may perform the pass/fail check operation by outputting the pass signal PASS when the number of counted failed bits is the same as or smaller than the number of correctable bits and output the fail signal FAIL when the number of counted failed bits is higher than the number of correctable bits.

Errors may be corrected in step S290.

In some embodiments, when it is determined that the number of failed bits counted in the steps S230, S260, and S280 is the same as or smaller than the number of correctable bits, read data determined to be failed bits of read data stored in the page buffer circuit 120 may be corrected by using an error correction circuit included in the control circuit 160.

Data may be output in step S300.

The corrected data in the page buffer circuit 120 may be output to an external device.

A block may be determined to be a failed block in step S310.

In some embodiments, when it is determined that the number of failed bits is higher than the number of correctable bits in step S280, the memory cell block 110 may be determined to be a failed block.

According to some embodiments, three read operations may be performed by using the A read voltage group, the B read voltage group, and the C read voltage group, respectively. According to some embodiments, the read operation may be repeated more than three times by adjusting a number of the read voltage groups.

Figure 4:
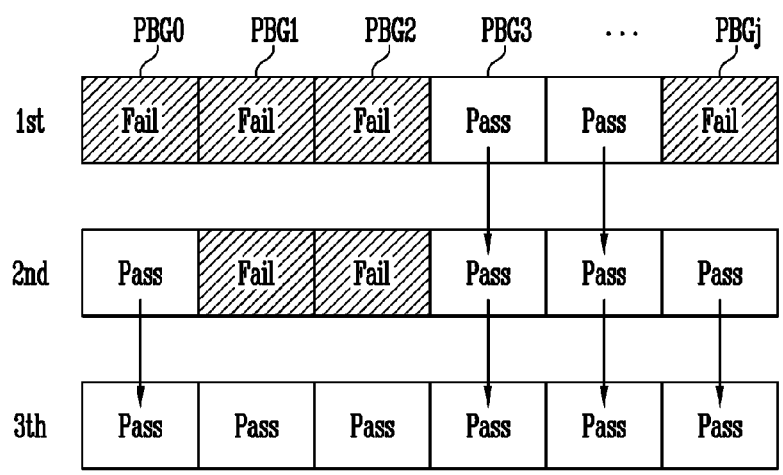
FIG. 4 is a view illustrating operation of a semiconductor memory device according to some embodiments.

FIG. 4 is a view illustrating operation of a semiconductor memory device according to some embodiments.

As shown in FIG. 4, when it is determined that page buffer groups PBG0, PBG1, PBG2, and PGBj of the page buffer groups PBG0 to PBGj are failed according to a first read operation and a failed bit detection operation using the A read voltage group, a second read operation and failed bit detection operation may be performed on the page buffer groups PBG0, PBG1, PBG2 and PGBj using the B read voltage group. The page buffer groups PGB1 and PBG2 of the page buffer groups PBG0, PBG1, PBG2 and PGBj are determined to have failed again. A third read operation and failed bit detection operation may be performed on the page buffer groups PGB1 and PBG2 using the C read voltage group.

According to some embodiments, the read operation and the failed bit detection operation may be repeated on the memory cells corresponding to the page buffer groups PBG0-PBGj determined to have failed in the read operation by using a compensation read voltage which having a reduced read voltage. Thus, a reliability of the read operation may be improved. In some embodiments, the step for repeating the read operation and the failed bit detection operation may be skipped on memory cells corresponding to the page buffer groups PBG0-PBGj determined to have passed, and so a velocity of the read operation may be enhanced.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
   a memory cell block configured to have memory cell groups;
   a peripheral circuit configured to read data by supplying a read voltage to memory cells in the memory cell groups;
   a fail detection circuit configured to perform a pass/fail check operation of the memory cell groups according to the data read by the peripheral circuit; and
   a control circuit configured to control the peripheral circuit and the fail detection circuit to perform again the read operation about the memory cell groups using a compensation read voltage different from the read voltage in the event that it is determined that one or more memory cell group is failed according to the pass/fail check operation.

2. The semiconductor memory device of claim 1, wherein the peripheral circuit includes:
   a voltage supplying circuit configured to generate the read voltage or the compensation read voltage in response to voltage supplying circuit control signals outputted from the control circuit;
   an X decoder configured to supply the read voltage or the compensation read voltage generated by the voltage supplying circuit to a selected word line of the memory cell block according to a row address; and
   a page buffer circuit configured to read and store the data of memory cells included in the memory cell groups.

3. The semiconductor memory device of claim 2, wherein the page buffer circuit includes page buffer groups corresponding to the memory cell groups.

4. The semiconductor memory device of claim 3, wherein the fail detection circuit detects failed bit of the data by using the data stored in the page buffers in each of the page buffer groups and counts the detected failed bit.

5. The semiconductor memory device of claim 4, wherein the fail detection circuit compares number of the counted failed bit with number of correctable bit by an error correction circuit, and outputs a pass/fail signal in accordance with the comparing result.

6. The semiconductor memory device of claim 4, wherein the control circuit controls the peripheral circuit to detect pass/fail of the memory cell groups according to the pass/fail signal, read again the data in a memory cell group determined as failed using the compensation read voltage lower than the read voltage and store the read data.

7. A semiconductor memory device comprising:
   a memory cell block configured to include memory cells;
   a voltage supplying circuit configured to supply a read voltage to a word line of the memory cell block in a read operation;
   a page buffer circuit configured to include page buffer groups for reading data in the memory cells and storing the read data when the read operation is performed;
   a fail detection circuit configured to perform a pass/fail check operation about each of the page buffer groups according to the read data stored in the page buffer groups; and
   a control circuit configured to control the voltage supplying circuit and the page buffer circuit to perform again the read operation about the memory cell block using a compensation read voltage lower than the read voltage in the event that it is determined that the read data stored in one or more page buffer group is failed according to the pass/fail check operation.

8. The semiconductor memory device of claim 7, wherein the memory cell block includes memory cell groups in the page buffer group.

9. The semiconductor memory device of claim 7, wherein the fail detection circuit detects failed bit of the read data by using the read data stored in page buffers in each of the page buffer groups, and counts the detected failed bit.

10. The semiconductor memory device of claim 9, wherein the fail detection circuit compares number of the counted failed bit with number of correctable bit by an error correction circuit, and outputs a pass/fail signal in accordance with the comparing result.

11. The semiconductor memory device of claim 9, wherein the control circuit controls the peripheral circuit to detect pass/fail of the memory cell groups according to the pass/fail signal, read again the data in a memory cell group determined as failed using the compensation read voltage and store the read data.

12. A method of operating a semiconductor memory device, the method comprising:
   performing a read operation using a read voltage;
   performing a pass/fail check operation about each of memory cell groups; and
   performing again the read operation using a compensation read voltage lower than the read voltage in the event that it is determined that one or more memory cell group is determined as failed according to the pass/fail check operation, wherein a memory cell group determined as passed in prior pass/fail check operation is determined as passed in the pass/fail check operation.

13. The method of claim 12, wherein the step of performing the pass/fail check operation includes:
   detecting failed bit of each of the memory cell groups;
   counting the detected failed bit; and
   comparing number of the counted failed bit with number of correctable bit, and performing the pass/fail check operation about each of the memory cell groups according to the comparing result.

14. The method of claim 12, wherein the read operation is performed again about a memory cell group determined as failed according to the pass/fail check operation by using the compensation read voltage, and the read operation about a memory cell group determined as passed is skipped.

15. The method of claim 14, wherein the pass/fail check operation about the memory cell group determined as passed is skipped when the pass/fail check operation is performed again after the read operation is performed again about the memory cell group determined as failed.

16. The method of claim 12, wherein the read data in the memory cell group determined as passed is corrected by an error correction circuit, and the corrected read data is outputted.

17. A method of operating a semiconductor memory device, the method comprising:
   reading data in a memory cell block including memory cell groups by using a first read voltage group;
   performing a pass/fail check operation about each of the memory cell groups; and
   reading again the data in the memory cell block including a memory cell group determined as failed using a second read voltage group lower than the first read voltage group in the event that it is determined that one or more memory cell group is failed according to the pass/fail checking operation, and performing again the pass/fail check operation.

18. The method of claim 17, further comprising:
   reading again the data in the memory cell block including a memory cell group determined as failed again using a third read voltage group lower than the second read voltage group in the event that it is determined that one or more memory cell group is failed again according to the pass/fail checking operation, and performing again the pass/fail check operation.

19. The method of claim 17, wherein the step of performing the pass/fail check operation includes:
   detecting failed bit of each of the memory cell groups;
   counting the detected failed bit; and
   performing the pass/fail check operation about each of the memory cell groups by comparing number of the counted failed bit with number of correctable bit.

20. The method of claim 17, wherein a step of reading the data in a memory cell group determined as passed according to the pass/fail check operation using the second read voltage group, a step of reading the data while the pass/fail check operation is performed and the pass/fail check operation are skipped.

* * * * *